(12) United States Patent
Han

(10) Patent No.: US 11,855,229 B2
(45) Date of Patent: Dec. 26, 2023

(54) SEMICONDUCTOR STRUCTURE AND METHOD FOR MANUFACTURING THE SAME

(71) Applicant: Joulwatt Technology Co., Ltd., Hangzhou (CN)

(72) Inventor: Guangtao Han, Hangzhou (CN)

(73) Assignee: JOULWATT TECHNOLOGY CO., LTD, Hangzhou (CN)

( * ) Notice: Subject to any disclaimer, the term of this patent is extended or adjusted under 35 U.S.C. 154(b) by 98 days.

(21) Appl. No.: 17/342,489

(22) Filed: Jun. 8, 2021

(65) Prior Publication Data

US 2021/0384361 A1     Dec. 9, 2021

(30) Foreign Application Priority Data

Jun. 9, 2020   (CN) .......................... 202010516208.4

(51) Int. Cl.
| | | |
|---|---|---|
| *H01L 29/872* | (2006.01) | |
| *H01L 29/06* | (2006.01) | |
| *H01L 29/66* | (2006.01) | |

(52) U.S. Cl.
CPC ........ *H01L 29/872* (2013.01); *H01L 29/0619* (2013.01); *H01L 29/0649* (2013.01); *H01L 29/66143* (2013.01)

(58) Field of Classification Search
CPC ........... H01L 29/66143; H01L 29/0649; H01L 29/0619; H01L 29/872; H01L 27/0262; H01L 21/8249; H01L 27/0255; H01L 27/0727; H01L 29/7816; H01L 29/7833; H01L 27/0629; H01L 29/0623; H01L 29/0653; H01L 27/092; H01L 29/1095; H01L 29/66825; H01L 29/78; H01L 29/40114; H01L 29/42356; H01L 21/761; H01L 27/0924; H01L 27/1203; H01L 29/1083; H01L 29/78645; H01L 29/78648;

(Continued)

(56) References Cited

U.S. PATENT DOCUMENTS 5,889,315 A * 3/1999 Farrenkopf ......... H01L 29/7833
257/552
5,925,910 A * 7/1999 Menegoli .......... H01L 29/66712
257/E27.033

(Continued)

FOREIGN PATENT DOCUMENTS

CN        205752185 U     11/2016

*Primary Examiner* — Mouloucoulaye Inoussa
(74) *Attorney, Agent, or Firm* — Treasure IP Group, LLC

(57) ABSTRACT

Disclosed is a semiconductor structure and a manufacturing method. The semiconductor structure includes an N-type doped region in a substrate; a metal structure on a surface of the substrate and including a middle portion and an edge portion, wherein the middle portion is in contact with the N-type doped region so as to form an SBD; a first P-type well region which is located in the N-type doped region, in contact with the edge portion and separates the edge portion from the N-type doped region; a first P-type contact region located in the first P-type well region and separated from the edge portion. When the first P-type contact region is grounded, the first P-type well region receives an anode voltage of the SBD. Low voltage drop and high frequency characteristics of the SBD are maintained on a premise of improving the breakdown voltage reducing the leak current.

10 Claims, 2 Drawing Sheets

(58) Field of Classification Search
CPC ... H01L 29/1037; H01L 21/76; H01L 21/762;
H01L 29/0692; H01L 21/823892; H01L
29/0847; H01L 27/2436; H01L 29/7841;
H01L 29/1087; H01L 27/0218; H01L
27/1211; H01L 29/785; H01L 29/78603;
H01L 21/823821; H01L 29/42344; H01L
29/7881; H01L 29/32; H01L 29/792;
H01L 29/66833; H01L 29/40117; H01L
21/26513; H01L 21/76224; H01L
29/42328; H01L 29/4238; H02M 7/217;
H02M 1/083; H02M 3/33592; Y02B
70/10; G11C 16/04; G11C 16/10; G11C
11/404; G11C 6/26; G11C 13/004; G11C
16/0408; G11C 13/0069; G11C 16/0466;
G11C 2213/79; H03K 19/20; H03K
19/21; H03K 19/0948
USPC ......... 257/49, 265, 337, 272, 476, 597, 268,
257/471, 328, 355, 552, 565, E21.002,
257/E21.54, E29.261, E29.338, E21.359;
438/414, 478, 400, 234, 186, 192, 194,
438/237, 167
See application file for complete search history.

(56) References Cited

U.S. PATENT DOCUMENTS

| | | | | |
|---|---|---|---|---|
| 7,808,223 | B1* | 10/2010 | Khanna | H02M 3/1584 323/272 |
| 9,941,350 | B1* | 4/2018 | Lin | H01L 21/28537 |
| 2002/0047176 | A1* | 4/2002 | Takahashi | H01L 27/092 257/E29.268 |
| 2003/0080355 | A1* | 5/2003 | Shirai | H01L 29/7802 257/E29.066 |
| 2004/0004263 | A1* | 1/2004 | Rothleitner | H01L 29/0882 257/500 |
| 2005/0098845 | A1* | 5/2005 | Matsudai | H01L 29/782 257/E27.033 |
| 2005/0275027 | A1* | 12/2005 | Mallikarjunaswamy | H01L 29/78 257/355 |
| 2006/0214222 | A1* | 9/2006 | Challa | H01L 29/7806 257/E29.066 |
| 2007/0052057 | A1* | 3/2007 | Drobny | H01L 29/872 257/471 |
| 2009/0065888 | A1* | 3/2009 | Kato | H01L 29/872 438/237 |
| 2009/0294865 | A1* | 12/2009 | Tang | H01L 29/0649 257/E27.024 |
| 2010/0073039 | A1* | 3/2010 | Kanai | H02M 7/5387 327/110 |
| 2010/0187577 | A1* | 7/2010 | Lin | H01L 29/66143 257/280 |
| 2010/0230774 | A1* | 9/2010 | Alter | H01L 29/7322 257/E29.338 |
| 2011/0012130 | A1* | 1/2011 | Zhang | H01L 29/1608 257/77 |
| 2011/0156810 | A1* | 6/2011 | Girdhar | H01L 29/782 438/237 |
| 2012/0061726 | A1* | 3/2012 | Tokura | H01L 29/405 257/141 |
| 2014/0001473 | A1* | 1/2014 | Chen | H01L 29/861 257/E27.06 |
| 2014/0001548 | A1* | 1/2014 | Chen | H01L 29/66143 257/E29.261 |
| 2014/0001549 | A1* | 1/2014 | Bode | H01L 29/7835 438/478 |
| 2014/0061731 | A1* | 3/2014 | Chen | H01L 29/107 257/272 |
| 2014/0061848 | A1* | 3/2014 | Chang | H01L 23/585 438/570 |
| 2014/0152349 | A1* | 6/2014 | Hung | H03K 17/063 327/109 |
| 2014/0252470 | A1* | 9/2014 | Chen | H01L 29/66659 438/234 |
| 2014/0332857 | A1* | 11/2014 | Chen | H01L 29/66901 438/192 |
| 2014/0332858 | A1* | 11/2014 | Chen | H01L 29/66901 257/268 |
| 2014/0367832 | A1* | 12/2014 | Marino | H01L 29/93 257/597 |
| 2015/0084118 | A1* | 3/2015 | Van Brunt | H01L 29/7806 438/237 |
| 2015/0243770 | A1* | 8/2015 | Hebert | H01L 29/732 257/586 |
| 2016/0343881 | A1* | 11/2016 | Pang | H01L 21/76 |
| 2018/0130903 | A1* | 5/2018 | Lin | H01L 21/761 |
| 2020/0135863 | A1* | 4/2020 | Han | G11C 16/04 |
| 2021/0119061 | A1* | 4/2021 | Huang | H01L 29/7816 |
| 2021/0351304 | A1* | 11/2021 | Schmidt | H01L 29/66143 |
| 2022/0199611 | A1* | 6/2022 | Chen | H01L 27/0262 |

\* cited by examiner

-Prior Art-

SEMICONDUCTOR STRUCTURE AND METHOD FOR MANUFACTURING THE SAME

CROSS-REFERENCE TO RELATED APPLICATIONS

The present application claims priority to the Chinese Patent Application No. 202010516208.4, filed on Jun. 9, 2020, and entitled "SEMICONDUCTOR STRUCTURE AND METHOD FOR MANUFACTURING THE SAME", which is incorporated herein by reference in its entirety.

FIELD OF TECHNOLOGY

The present application relates to a technical field of manufacturing a semiconductor device, and more particularly relates to a semiconductor structure and a method for manufacturing the same.

BACKGROUND

An SBD (Schottky Barrier Diode) has advantages of high switching frequency and low forward voltage drop, and is widely used in electronic circuits. As shown in FIG. 1, an SBD in the prior art includes Schottky junctions formed by a metal structure 10 and an N-type semiconductor 20 with a low doping concentration. A Schottky junction formed between a middle portion of the metal structure 10 and the N-type semiconductor 20 extends along a planar interface. A Schottky junction formed between each edge portion of the metal structure 10 and the N-type semiconductor 20 extends along an arc interface. Under a condition that a positive voltage is applied to the N-type semiconductor 20 to deplete the N-type semiconductor 20, the Schottky junction (depletion layer) corresponding to each edge portion of the metal structure 10 has a certain curvature (referring to a dotted line in FIG. 1), so that an electric field here is rather strong, which further introduces a band-to-band tunneling current, thus a reverse leak current of the SBD is increased. Under a condition that the electric field is rather strong and continuously increases, the SBD may break down in advance, causing a breakdown voltage of the SBD to be relatively low.

Therefore, an improved semiconductor structure and a method for manufacturing the same are expected to be provided, so as to improve the breakdown voltage of the SBD and reduce the leak current of the SBD.

SUMMARY OF THE INVENTION

In view of this, the present disclosure provides an improved semiconductor structure and a method for manufacturing the same. By connecting an anode of an SBD with a first P-type well region and connecting the first P-type well region to ground through a first P-type contact region, the characteristics of high frequency and low voltage drop of the SBD can be maintained on a premise that a breakdown voltage of the SBD is improved and a leak current of the SBD is reduced.

According to one aspect of an embodiment of the present disclosure, a semiconductor structure is provided, and comprises: a substrate; an N-type doped region located in the substrate; a metal structure which is located on a surface of the substrate and comprises a middle portion and an edge portion, wherein the middle portion is in contact with the N-type doped region so that an SBD is formed; a first P-type well region, which is located in the N-type doped region, is in contact with the edge portion, and separates the edge portion from the N-type doped region; and a first P-type contact region located in the first P-type well region and separated from the edge portion. A doping concentration of the first P-type contact region is higher than a doping concentration of the first P-type well region. In a state that the first P-type contact region is grounded, the first P-type well region is configured to receive an anode voltage of the SBD.

In some embodiments, the semiconductor structure further comprises: an N-type well region located in the N-type doped region and separated from the edge portion, and a first N-type contact region located in the N-type well regions. A doping concentration of the first N-type contact region is higher than a doping concentration of the N-type well region. The first N-type contact region is configured to receive a cathode voltage of the SBD.

In some embodiments, the N-type well region surrounds the first P-type well region.

In some embodiments, the semiconductor structure further comprises: a second P-type well region located in the substrate; and a second P-type contact region which is located in the second P-type well region and is grounded. A doping type of the substrate is P-type.

In some embodiments, the second P-type well region surrounds the N-type doped region.

In some embodiments, the semiconductor structure further comprises a plurality of isolation portions, which are located between the first P-type contact region and the edge portion, between the first P-type contact region and the first N-type contact region, and between the first N-type contact region and the second P-type contact region, respectively.

In some embodiments, the semiconductor structure further comprises: a second N-type contact region which is located in the first P-type well region and is in contact with the edge portion, a doping concentration of the second N-type contact region is higher than the doping concentration of the first P-type well region. The second N-type contact region is configured to receive the anode voltage of the SBD.

In some embodiments, the semiconductor structure further comprises: an insulation layer located on the substrate and covering the metal structure. The insulation layer is provided with an anode contact hole exposing the edge portion. The anode contact hole is located corresponding to the second N-type contact region.

In some embodiments, the semiconductor structure further comprises: a plurality of conductive structures, which are in contact with the first P-type contact region, the second P-type contact region and the first N-type contact region, respectively.

In some embodiments, the insulation layer is further provided with a cathode contact hole and ground contact holes. The cathode contact hole exposes a corresponding conductive structure of the plurality of conductive structures, which covers the first N-type contact region, and the ground contact holes respectively expose corresponding conductive structures of the plurality of conductive structures, wherein said corresponding conductive structures cover the first P-type contact region and the second P-type contact region.

In some embodiments, each of the plurality of isolation portions comprises an SIT (Shallow Trench Isolation) portion and/or a Locos (Local Oxidation of Silicon) isolation portion.

According to the other aspect of an embodiment of the present disclosure, a method for manufacturing a semiconductor structure is provided, and includes: forming the semiconductor structure according to the present disclosure.

According to the semiconductor structure and the method for manufacturing the same provided by the embodiments of the present disclosure, the SBD is formed by the metal structure and the N-type doped region, the first P-type well region is formed in the N-type doped region, is in contact with the edge portion of the metal structure and separates the edge portion of the metal structure from the N-type doped region, so that the anode of the SBD is connected with the first P-type well region, and the first P-type well region is grounded through the first P-type contact region. Compared with the prior art, the semiconductor structure introduces a PN junction at the edge portion of the metal structure, thus the depletion layer in the device extends towards two sides of the edge of the metal structure, reducing the edge curvature of the Schottky junction compared with the prior art, so as to improve the breakdown voltage of the SBD and reduce the leak current of the SBD.

At the same time, under the condition that a positive voltage is applied to the anode of the SBD, the Schottky junction is forward biased, and the first P-type well region is grounded through the first P-type contact region, thus the PN junction formed by the first P-type well region and the N-type doped region cannot work. Under the condition that a negative voltage is applied to the anode of the SBD, the PN junction formed by the first P-type well region and the N-type doped region is connected in parallel with the Schottky junction, and both the PN junction and the Schottky junction are reversely biased, thus the breakdown voltage of the SBD is further improved, the leak current of the SBD is further reduced, and additionally, the characteristics of low voltage drop and high frequency of the SBD are maintained.

Furthermore, by forming the second N-type contact region in the first P-type well region, the second N-type contact region and the edge portion of the metal structure form ohmic contact. In a step of forming the anode contact holes, positions of the anode contact holes correspond to the second N-type contact region, so that etching windows of the anode contact holes are extended, and a risk of causing the reverse electric leakage of the SBD by a damage on the silicon surface due to over etching in the anode contact holes, can be reduced.

Therefore, product performances can be greatly improved by using the semiconductor structure and the method for manufacturing the same, which are provided according to the present disclosure.

BRIEF DESCRIPTION OF THE DRAWINGS

In order to illustrate technical solutions according to embodiments of the present application more clearly, drawings of some embodiments are briefly described hereafter. Obviously, the drawings in the following description only relate to some embodiments of the present application, and are not intended to limit the present application.

DESCRIPTION OF THE EMBODIMENTS

Figure 1:
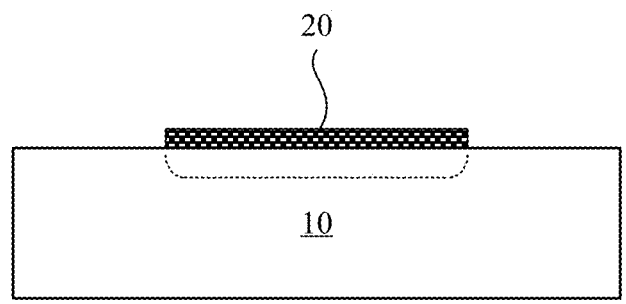
FIG. 1 shows a schematic diagram of an SBD in the prior art.

The present disclosure will be described in more detail below with reference to the drawings. In the various figures, same elements are denoted by similar reference numerals. For the sake of clarity, each part in the drawings is not drawn to scale. Additionally, some well-known parts may not be shown. For the sake of simplicity, a semiconductor structure obtained after several steps can be described in one figure.

It should be understood that when a structure of a device is described, if a layer (or a region) is referred to as being "on" or "above" another layer (or another region), it can be directly located on another layer (or another region), or other layers (or other regions) are also included between the layer and another layer (or another region). Additionally, if the device is turned up side down, the layer (or the region) will be "under" or "below" another layer (or another region).

For describing a condition that a layer (or a region) is directly located on another layer (or another region), statements such as "directly on . . . " or "directly on and contact with . . . " will be used therein.

Various specific details of the present disclosure are described hereafter, such as a structure, a material, a dimension, a processing process and a technology of a device, so as to make the present disclosure clearly understood. However, as will be understood by those skilled in the art, the present disclosure may be practiced without these specific details.

The present disclosure can be embodied in various forms, some of which are described below.

Figure 2:
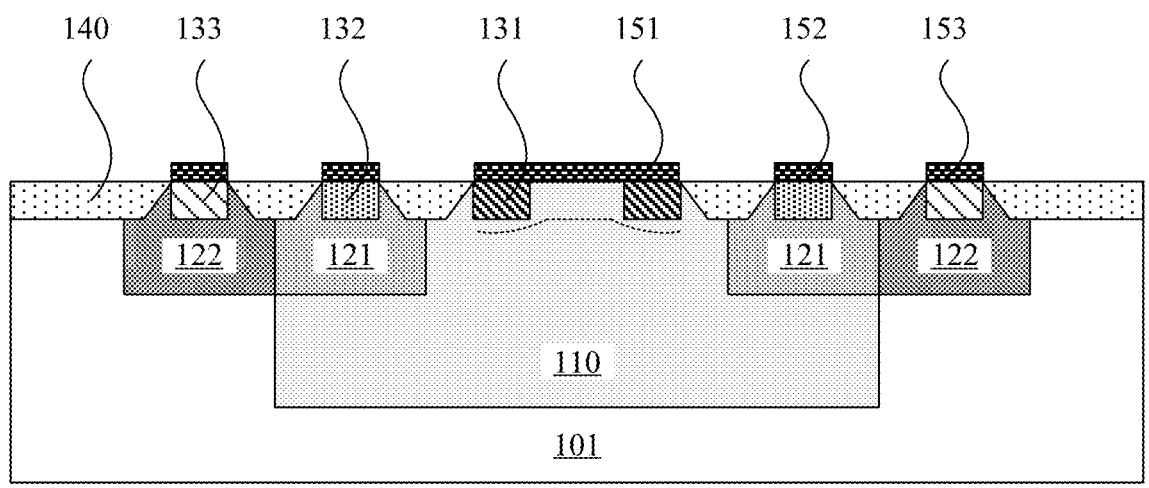
FIG. 2 and FIG. 3 show schematic diagrams of a semiconductor structure comprising an SBD.
Figure 3:
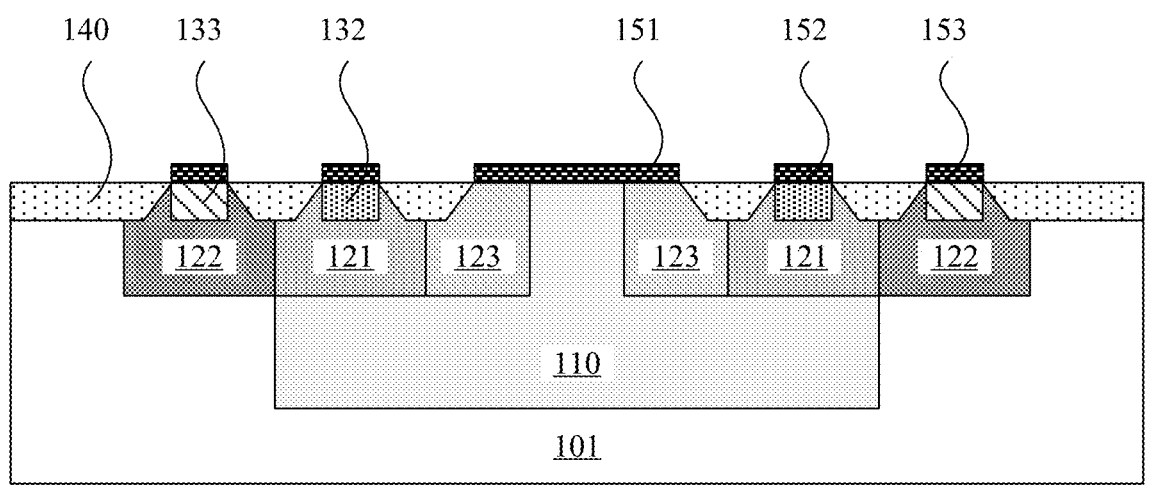

FIG. 2 and FIG. 3 show schematic diagrams of a semiconductor structure comprising an SBD. In order to solve problems that an SDB in the prior art has a relatively large leak current and a relatively low breakdown voltage, P-type impurities can be introduced. Two semiconductor structures shown in FIG. 2 and FIG. 3 are going to be specifically illustrated below.

The semiconductor structure as shown in FIG. 2 includes a P-type substrate 101, an N-type doped region 110, an N-type well region 121, a P-type well region 122, P-type contact regions 131 and 133, an N-type contact region 132, a plurality of isolation portions 140, a metal anode electrode 151, a cathode electrode 152 and a ground electrode 153. The N-type doped region 110 is located in the substrate 101. The N-type well region 121 is located in the N-type doped region 110. The P-type well region 122 is located in the substrate 101 and surround the N-type doped region 110. The P-type contact region 131 is located in the N-type doped region 110. The N-type contact region 132 is located in the N-type well region 121. The P-type contact region 133 is located in the P-type well region 122. A doping concentration of the P-type contact region 131 is higher than that of the N-type well region 121. A doping concentration of the N-type doped region 110 is lower than that of the N-type doped region 121. The plurality of isolation portions 140 are respectively located between the first P-type contact region 131 and the N-type contact region 132, between the N-type contact region 132 and the P-type contact region 133, and at one side (away from the N-type contact region 132) of the P-type contact region 133. Regions among the plurality of isolation portions 140 serve as active regions of the semiconductor structure. The metal anode electrode 151, the cathode electrode 152 and the ground electrode 153 are located above the substrate 101. Metal silicide is formed in a contact portion of the metal anode electrode 151, wherein the contact portion of the metal anode electrode 151 is in contact with the N-type doped region 110. The N-type doped region 110 and a middle portion of the metal anode electrode 151 form an SBD (Schottky Barrier Diode). An edge portion of the metal anode electrode 151 is in ohmic contact with the P-type contact region 131. The cathode electrode 152 is in contact with the N-type contact region 132. The ground electrode 153 is in contact with the P-type contact region 133. It should be understood that a number of the N-type well region 121, the P-type well region 122, the P-type contact regions 131, 133, the N-type contact region 132, the plurality of isolation portions 140, the metal anode electrode 151, the cathode electrode 152 and the ground electrode 153 all could be one or more, which will not limit the protection scope of the present disclosure. In other embodiments of the present disclosure, the similarities should be understood correspondingly.

In the semiconductor structure as shown in FIG. 2, the P-type contact region 131 is located at two ends of the metal anode electrode 151, and form ohmic contact with the edge portion of the metal anode electrode 151, so that a depletion layer is lengthened in the N-type doped region 110, the depletion layer extends towards two side of the edge of the metal anode electrode 151 (referring to a dotted line shown in FIG. 2), thus an edge curvature of a Schottky junction is further reduced, and a breakdown voltage of the edge of the Schottky junction is increased. However, the P-type contact region 131 and the metal anode electrode 151 are in ohmic contact, so that a silicon PN junction, formed by the P-type contact region 131 and the N-type doped region 110, is connected in parallel in the SBD. Under a condition that a positive voltage is applied to the metal anode electrode 151, and a positive current flowing through the SBD is relatively high, the silicon PN junction may also be conducted, so that an operation performed by the single SBD becomes a joint operation performed by the SBD and the silicon PN junction. Under a condition that two types of current carriers both participate in conduction, low voltage drop characteristics and high frequency characteristics of the SBD may be weakened.

In the semiconductor structure as shown in FIG. 3, a P-type well region 123 is formed to replace the P-type contact region 131 (referring to FIG. 2), which is the only difference compared with the semiconductor structure shown in FIG. 2. A doping concentration of the P-type well region 123 is lower than that of the P-type contact region 131, no ohmic contact is formed between the p-type well region 123 and the metal anode electrode 151, and the P-type well region 123 is nearly in a floating state. Under a condition that the P-type well region 123 does not form ohmic contact with the metal anode electrode 151, the SBD cannot be connected with a new silicon PN junction in parallel, and still only electrons participate in conduction in the device. However, since the introduced P-type well region 123 is nearly in the floating state, under a condition that a reverse voltage is applied to the metal anode electrode 151, the P-type well region 123 will be depleted, and holes need to flow out. Under a condition that the voltage applied to the metal anode electrode 151 is suddenly switched to be a positive voltage, the P-type well region 123 is no longer in a depleted state, and the holes need to be supplemented quickly due to flowing out under the depleted state. However, since the P-type well region 123 is nearly in the floating state, the P-type well region 123 cannot be depleted and recovered rapidly, which sacrifices the high-frequency performance of the SBD.

Figure 4:
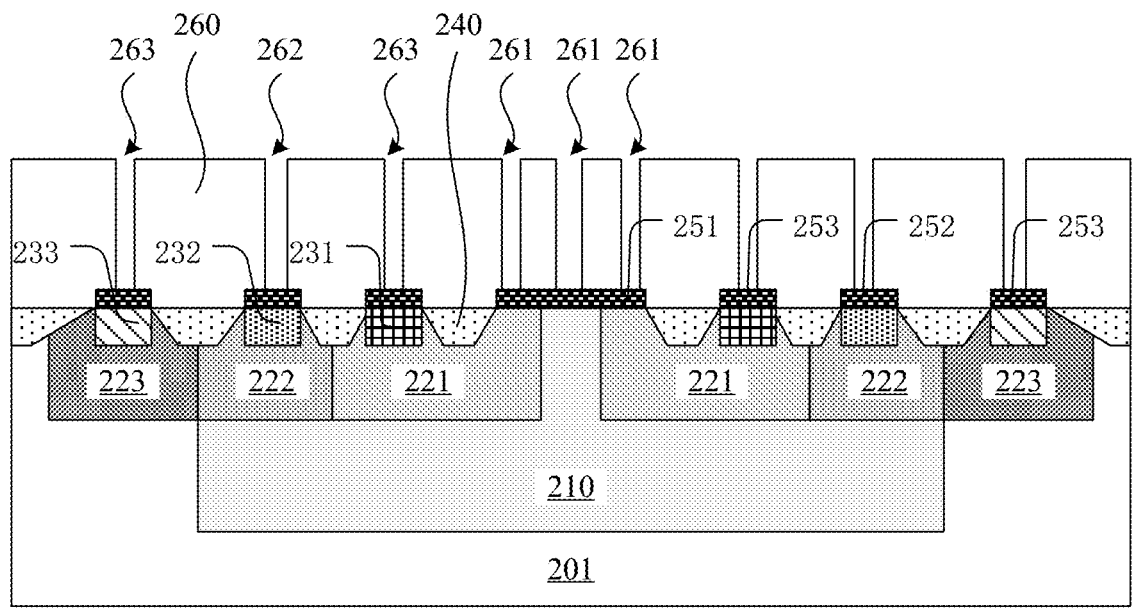
FIG. 4 shows a schematic diagram of a semiconductor structure according to a first embodiment of the present disclosure.

FIG. 4 shows a schematic diagram of a semiconductor structure according to a first embodiment of the present disclosure.

As shown in FIG. 4, the semiconductor structure according the first embodiment of the present disclosure comprises: a substrate 201, an N-type doped region 210, a first P-type well region 221, an N-type well region 222, a second P-type well region 223, a first P-type contact region 231, a first N-type contact region 232, a second P-type contact region 233, a metal anode electrode 251 (metal structure), a cathode electrode 252, ground electrodes 253 and an insulation layer 260. The substrate 201 is, for example, a P-type doped silicon substrate.

The N-type doped region 210 and the second P-type well region 223 are located in the substrate 201. The first P-type well region 221 and the N-type well region 222 are located in the N-type doped region 210. The first P-type contact region 231 is located in the first P-type well region 221. The first N-type contact region 232 is located in the N-type well region 222. The second P-type contact region 233 is located in the second P-type well region 223. In the present embodiment, doping concentrations of the contact regions (231, 232 and 233) are higher than doping concentrations of the well regions (221, 222 and 223) respectively, and each of the doping concentrations of the well regions (221, 222 and 223) is higher than a doping concentration of the N-type doping region 210. However, embodiments of the present disclosure is not limited thereto, for example, those skilled in the art may replace the first P-type well regions 221 into other lightly doped P-type structures.

In some specific embodiments, the N-type well region 222 surrounds the first P-type well region 221, and is in contact with the first P-type well region 221. The second P-type well region 223 surrounds the N-type doped region 210, and is in contact with the N-type doped region 210 and the N-type well region 222.

The N-type doped region 210, the first P-type well region 221, the N-type well region 222, the second P-type well region 223, the first P-type contact region 231, the first N-type contact region 232 and the second P-type contact region 233 all extend from a first surface towards a second surface of the substrate 201. The first surface of the substrate 201 is opposite to the second surface.

A plurality of isolation portions 240 are respectively located between the metal anode electrode 251 and the first P-type contact region 231, between the first P-type contact region 231 and the first N-type contact region 232, between the first N-type contact region 232 and the second P-type contact region 233, and at one side (away from the first N-type contact region 232) of the second P-type contact region 233. Regions among the isolation portions 240 serve as active regions of the semiconductor structure. The plurality of isolation portions 240 comprise an SIT (Shallow Trench Isolation) portion and/or a Locos (Local Oxidation of Silicon) isolation portion.

The metal anode electrode 251, the cathode electrode 252 and the ground electrodes 253 are all located on the first surface of the substrate 201, and each forms metal silicide in a portion which is in contact with the first surface of the substrate 201. The metal anode electrode 251 comprises a middle portion and an edge portion, the middle portion is in contact with the N-type doped region 210 to form an SBD, the edge portion is in contact with the first P-type well region 221. Additionally, the edge portion is separated from the N-type doped region 210 and the N-type well region 222 by the first P-type well region 221. The cathode electrode 252 covers the first N-type doped region 232 and form ohmic contact with the first N-type doped region 232. The ground electrodes 233 cover the first P-type doped region 231 and the second P-type doped region 233, respectively, and form ohmic contacts with the first P-type doped region 231 and the second P-type doped region 233 respectively.

The insulation layer 260 is located on the substrate 201, and covers the metal anode electrode 251, the cathode electrode 252 and the ground electrodes 253. The insulation layer 260 is provided with a plurality of anode contact holes 261, one or more cathode contact holes 262 and one or more ground contact holes 263. In the present embodiment, a portion of the cathode electrode 252 is exposed by a corresponding cathode contact hole 262, a portion of the ground electrodes 253 is exposed by a corresponding ground contact hole 263, and portions of the metal anode electrode 251 are exposed by the plurality of anode contact holes 261. A middle portion of the metal anode electrode 251 is exposed by one part of the plurality of anode contact holes 261, and an edge portion of the metal anode electrode 251 is exposed by the other parts of the plurality of anode contact holes 261. In subsequent steps, each anode contact hole 261, each cathode contact hole 262 and each ground contact hole 263 can be filled with conductive material, such that the metal anode electrode 251, the cathode electrode 252 and the ground electrodes 253 can be led out by the conductive material.

In the semiconductor structure as shown in FIG. 4, firstly, the edge curvature of the Schottky junction is reduced due to the first P-type well region 221, and the breakdown voltage at the edge of the Schottky junction is improved. Then, in an active region different from the SBD, the first P-type well region 221 is grounded by using the first P-type contact region 231 and the ground electrodes 253. In other words, the first P-type well region 221 and the anode of the SBD are connected together. Therefore, in a state that the SBD is reversely biased, the SBD is connected in parallel with a silicon PN junction formed by the first P-type well region 221 and the N-type doped region 210; while in a state that the SBD is forward biased, only the SBD junction is forward biased, and the silicon PN junction cannot be forward biased. Therefore, on the premise that the structure improves the reverse breakdown voltage of the SBD, neither is the SBD forced to be connected to the silicon PN junction in parallel, nor is the high-frequency characteristic of the SBD influenced by the introduction of the floating P-type well region. That is to say, the reverse breakdown voltage of the SBD is improved, the leak current is reduced, and at the same time, the characteristics of high frequency and that single-type current carriers participate in conduction of the SBD can be maintained.

Figure 5:
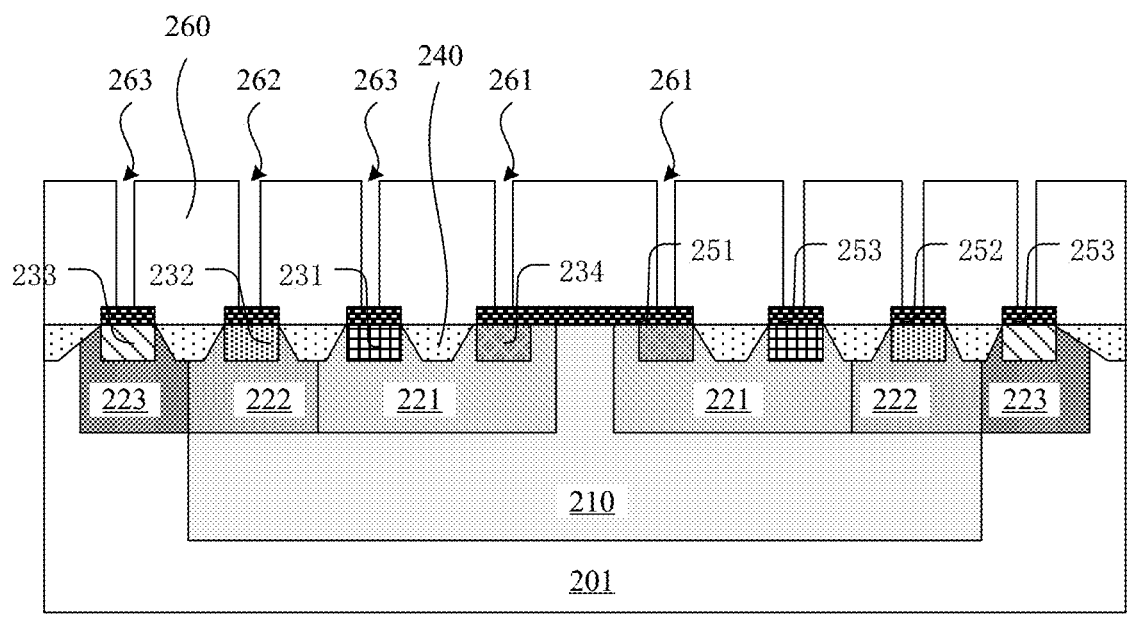
FIG. 5 shows a schematic diagram of a semiconductor structure according to a second embodiment of the present disclosure.

FIG. 5 shows a schematic diagram of a semiconductor structure according to a second embodiment of the present disclosure.

As shown in FIG. 5, the semiconductor structure according to the second embodiment of the present disclosure comprises: a substrate 201, an N-type doped region 210, a first P-type well region 221, an N-type well region 222, a second P-type well region 223, a first P-type contact region 231, a first N-type contact region 232, a second P-type contact region 233, a second N-type contact region 234, a metal anode electrode 251, a cathode electrode 252, ground electrodes 253 and an insulation layer 260. The insulation layer 260 is provided with one or more anode contact holes 261, one or more cathode contact holes 262 and one or more ground contact holes 263. The semiconductor structure according to the second embodiment of the present disclosure is roughly similar with the semiconductor structure according to the first embodiment, and the similarities will not be repeated herein. Compared with the semiconductor structure according to the first embodiment, the semiconductor structure according to the second embodiment additionally comprises the second N-type contact region 234, which is located in the first P-type well region 221, and in contact with the edge portion of the metal anode electrode 251. The second N-type contact region 234 has a doping concentration higher than a doping concentration of the first P-type well region 221. The anode contact holes 261 only expose the edge portion of the metal anode electrode 251, and each anode contact hole 261 is located corresponding to the second N-type contact region 234. Under a condition that the SBD is reversely biased, the SBD is still connected in parallel with the silicon PN junction formed by the first P-type well region 221 and the N-type doped region 210; while under a condition that the SBD is forward biased, a PN junction formed between the second N-type contact region 234 and the first P-type well region 221 is biased reversely to prevent the silicon PN junction from participating in the operation, so that the silicon PN junction cannot be forward biased when the SBD is forward biased.

In the first embodiment, the anode contact holes 261 are, for example, formed by an etching process. The anode contact holes 261 are located corresponding to the active region where the whole SBD is located in. If a stop position of the etching process is not precisely controlled, the anode contact holes 261 may penetrate through the metal anode electrode 251 and damage the silicon surface, thus easily leading to a reverse electric leakage of the SBD. Compared with the first embodiment, the second embodiment eliminates each anode contact hole 261 which exposes the middle portion of the metal anode electrode 251, and arranges each anode contact hole 261 at a position corresponding to the second N-type contact region 234. Because the second N-type contact region 234 and the edge portion of the metal anode electrode 251 can form ohmic contact, the second N-type contact region 234 and the metal anode electrode 251 are directly conducted, so as to prevent current leakage problem from occurring even when the anode contact holes 261 penetrate through the metal anode electrode 251 and the second N-type contact region 234.

Embodiments of the present disclosure further provides a method for manufacturing a semiconductor structure, for forming the semiconductor structure according to the first embodiment and/or the second embodiment.

According to the semiconductor structure and the method for manufacturing the same provided by the embodiments of the present disclosure, the SBD is formed by the metal structure and the N-type doped region, the first P-type well region is formed in the N-type doped region, the first P-type well region is in contact with the edge portion of the metal structure and separate the edge portion of the metal structure from the N-type doped region, so that the anode of the SBD is connected with the first P-type well region, and the first P-type well region is grounded through the first P-type contact region. Compared with the prior art, the semiconductor structure introduces a PN junction at the edge portion of the metal structure, thus the depletion layer in the device extends towards two sides of the edge of the metal structure, reducing the edge curvature of the Schottky junction compared with the prior art, so as to improve the breakdown voltage of the SBD and reduce the leak current of the SBD.

At the same time, under the condition that a positive voltage is applied to the anode of the SBD, the Schottky junction is forward biased, and the first P-type well region is grounded through the first P-type contact region, thus the PN junction formed by the first P-type well region and the N-type doped region cannot work. Under the condition that a negative voltage is applied to the anode of the SBD, the PN junction formed by the first P-type well region and the N-type doped region is connected in parallel with the Schottky junction, and both the PN junction and the Schottky junction are reversely biased, thus the breakdown voltage of the SBD is further improved, the leak current of the SBD is further reduced, and additionally, the characteristics of low voltage drop and high frequency of the SBD are maintained.

Furthermore, by forming the second N-type contact region in the first P-type well region, the second N-type contact region and the edge portion of the metal structure form ohmic contact. In a step of forming the anode contact holes, positions of the anode contact holes correspond to the second N-type contact region, so that etching windows of the anode contact holes are extended, and a risk of causing the reverse electric leakage of the SBD by a damage on the silicon surface due to over etching in the anode contact holes, can be reduced.

Therefore, product performances can be greatly improved by using the semiconductor structure and the method for manufacturing the same, which are provided according to the present disclosure.

In the above description, technical details of layouts of each layer, etching and the like are not illuminated in detail. However, it should be understood by those skilled in the art that layers, regions and the like in required shapes can be formed through various technical measures. Additionally, in order to form a same structure, those skilled in the art can also design methods which are not completely identical to the method described above. Additionally, although each embodiment is respectively described above, it does not mean that measures in each embodiment cannot be favorably combined to be used.

The embodiments of the disclosure are described above. However, these embodiments are presented for purposes of illustration only, and are not intended to limit the scope of the disclosure. The scope of the disclosure is defined by the attached claims and their equivalents. Those skilled in the art can make various substitutions and modifications without departing from the scope of the disclosure, and these substitutions and modifications should all fall within the scope of the disclosure.

The invention claimed is:

1. A semiconductor structure, comprising:
a substrate;
an N-type doped region, located in the substrate;
a metal structure, located on a surface of the substrate and comprising a middle portion and an edge portion, wherein the middle portion is in contact with the N-type doped region so as to form a Schottky Barrier Diode;
a first P-type well region, which is located in the N-type doped region, in contact with the edge portion and separates the edge portion from the N-type doped region;
an insulation layer located on the substrate and covering the metal structure; and
a first P-type contact region, which is located in the first P-type well region and separated from the edge portion,
wherein a doping concentration of the first P-type contact region is higher than a doping concentration of the first P-type well region, and in a state that the first P-type contact region is grounded, the first P-type well region is configured to receive an anode voltage of the Schottky Barrier Diode,
wherein the insulation layer has an anode contact hole, which extends from an upper surface of the insulation layer to an upper surface of the metal structure and is located corresponding to a portion in the first P-type well region, so that the edge portion of the metal structure is connected to an anode electrode of the Schottky Barrier Diode through the anode contact hole,
wherein the semiconductor structure further comprises a second N-type contact region, which is located in the first P-type well region and is in contact with the edge portion, a doping concentration of the second N-type contact region is higher than a doping concentration of the first P-type well region, and the second N-type contact region is configured to receive the anode voltage of the Schottky Barrier Diode.

2. The semiconductor structure according to claim 1, further comprising:
an N-type well region, which is located in the N-type doped region and separated from the edge portion, and
a first N-type contact region located in the N-type well region, wherein a doping concentration of the first N-type contact region is higher than a doping concentration of the N-type well region,
wherein the first N-type contact region is configured to receive a cathode voltage of the Schottky Barrier Diode.

3. The semiconductor structure according to claim 2, wherein the N-type well region surrounds the first P-type well region.

4. The semiconductor structure according to claim 2, further comprising:
a second P-type well region, located in the substrate; and
a second P-type contact region, which is located in the second P-type well region and is grounded,
wherein a doping type of the substrate is P type.

5. The semiconductor structure according to claim 4, wherein the second P-type well region surrounds the N-type doped region.

6. The semiconductor structure according to claim 4, further comprising a plurality of isolation portions, which are located between the first P-type contact region and the edge portion, between the first P-type contact region and the first N-type contact region, and between the first N-type contact region and the second P-type contact region, respectively.

7. The semiconductor structure according to claim 1, the anode contact hole is located corresponding to the second N-type contact region.

8. The semiconductor structure according to claim 7, further comprising a plurality of conductive structures, which are in contact with the first P-type contact region, the second P-type contact region and the first N-type contact region, respectively,
wherein the insulation layer is further provided with a cathode contact hole and ground contact holes, the cathode contact hole is configured to expose a corresponding conductive structure of the plurality of conductive structures, which covers the first N-type contact region, and the ground contact holes are configured to respectively expose corresponding conductive structures of the plurality of conductive structures, the corresponding structures cover the first P-type contact region and the second P-type contact region, respectively.

9. A method for manufacturing a semiconductor structure, comprising: forming the semiconductor structure according to claim 1, comprising
   forming the N-type doped region in the substrate;
   forming the metal structure on a surface of the substrate;
   forming the first P-type well region in the N-type doped region; and
   forming the first P-type contact region in the first P-type well region.

10. The semiconductor structure according to claim 6, wherein each of the plurality of isolation portions comprises a shallow trench isolation portion and/or a local oxidation of silicon isolation portion.

* * * * *